United States Patent

Sun et al.

[11] Patent Number: 5,841,186
[45] Date of Patent: Nov. 24, 1998

[54] COMPOSITE DIELECTRIC FILMS

[75] Inventors: Shi-Chung Sun, Taipei; Tsai-Fu Chen, Kaoshiung Hsien, both of Taiwan

[73] Assignee: United Microelectronics Corp., Taiwan

[21] Appl. No.: 912,867

[22] Filed: Aug. 19, 1997

[51] Int. Cl.[6] ............................................ H01L 23/58
[52] U.S. Cl. ............................ 257/635; 257/754; 257/636
[58] Field of Search ..................................... 257/632, 635, 257/637, 636, 646, 754

[56] References Cited

U.S. PATENT DOCUMENTS 4,987,102  1/1991  Nguyen et al. .
5,406,446  4/1995  Peters et al. .

Primary Examiner—Mahshid D. Saadat
Assistant Examiner—S. V. Clark
Attorney, Agent, or Firm—Rabin & Champagne, P.C.

[57] ABSTRACT

Composite $TiO_2/Ta_2O_5$ films by in-situ sequential CVD deposition are presented for a storage capacitor of a three-dimensional cell in DRAM applications. The capacitor with the $Ta_2O_5/TiO_2/Ta_2O_5$ alternating layer structure has comparable leakage current density and higher capacitance per unit area as compared to a capacitor with $Ta_2O_5$ and $TiO_2$ single layer structures.

8 Claims, 4 Drawing Sheets

I : TiO$_2$
A : Ta$_2$O$_5$

COMPOSITE DIELECTRIC FILMS

BACKGROUND OF THE INVENTION

1. Field of the Invention

The invention relates to composite dielectric films, and more particularly to composite $Ta_2O_5/TiO_2/Ta_2O_5$ films formed using in-situ sequential CVD deposition, and used for the capacitor in a DRAM.

2. Description of the Related Art

With the shrinkage of the feature size of very large integrated circuits (VLSIs), it is necessary and inevitable to introduce a three-dimensional capacitor structure (e.g. stacked or trench structure) for advanced dynamic random access memories (DRAMs). However, further shrinkage requires very complex structures. In order to make the process simple, high dielectrics, which provide sufficient storage charge to prevent soft errors without use of complicated capacitor structure, have been studied extensively. It is to be noted that the high dielectrics must possess a satisfactory leakage current for practical use.

With a relatively high dielectric constant (20–25), an excellent step coverage, and a rather low leakage current after post-deposition annealing treatment, tantalum pentaoxide ($Ta_2O_5$) films, made from chemical vapor deposited tantalum pentaoxide (CVD $Ta_2O_5$), are one of the most common dielectric films. Schematic cross-sectional views of the structures of capacitors with single and composite films are shown in FIG. 1. A single $Ta_2O_5$ layer film, noted as A, is formed on a phosphorus-doped polysilicon ($n^+$ poly-Si) bottom electrode. On top of the $Ta_2O_5$ dielectric film, a titanium nitride (TiN) and aluminum (Al) (not shown) top electrode is formed by reactive sputtering.

Recently, there is a growing interest in titanium dioxide ($TiO_2$) because of its higher dielectric constant (30–100). In FIG. 1, the structure of the capacitor with a single $TiO_2$ film noted as I is shown. Similar to the single $Ta_2O_5$ dielectric film, the $TiO_2$ dielectric film is formed on the bottom $n^+$ poly-Si electrode, and with a TiN and Al electrode on top.

The capacitance per unit area of the above single dielectric films is graphically illustrated in FIG. 4. Due to the much higher dielectric constant in the $TiO_2$ film (I), the capacitance of the capacitor with film I is much higher than the capacitance of the capacitor with film A. However, referring to FIG. 2a, FIG. 2b, FIG. 6a, and FIG. 6b, the leakage current of film I is the largest, and is the smallest in film A. The larger leakage current in film I is due to the lower energy band gap of the $TiO_2$ film (3 eV to 4 eV for $TiO_2$, and 4 eV to 5 eV for $Ta_2O_5$) and to the film's microstructure, which will be discussed further hereinafter. In addition, the breakdown voltage distribution is shown in FIG. 3. Film A can sustain a higher voltage than film I.

SUMMARY OF THE INVENTION

It is therefore an object of the invention to provide a dielectric film with a higher dielectric constant, and thus, with a higher magnitude of capacitance.

It is a further object of the invention to provide a dielectric film with a satisfactory leakage current and a lower breakdown voltage.

To achieve these objects and advantages, and in accordance with the purpose of the invention, as embodied and broadly described herein, the invention is directed towards a composite dielectric film, comprising a phosphorus doped polysilicon bottom electrode. Rapid thermal nitridation is performed in ammonia at 900° C. for about 60 seconds for the phosphorus doped polysilicon bottom electrode. A first tantalum pentaoxide layer is formed on the phosphorus doped polysilicon bottom electrode by low pressure chemical vapor deposition from a mixture of pentaethoxyl tantalum and oxygen gas. A titanium dioxide layer is formed on the first tantalum pentaoxide layer by low pressure chemical vapor deposition from a mixture of tetra-isopropyl-titanate and oxygen gas. A second tantalum pentaoxide layer is formed on the titanium dioxide layer. After the deposition of the composite dielectric film, rapid thermal nitrous oxide annealing is performed at 800° C. for about 60 seconds. A titanium nitride and aluminum top electrode is formed by reactive sputtering.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

Figure 1:
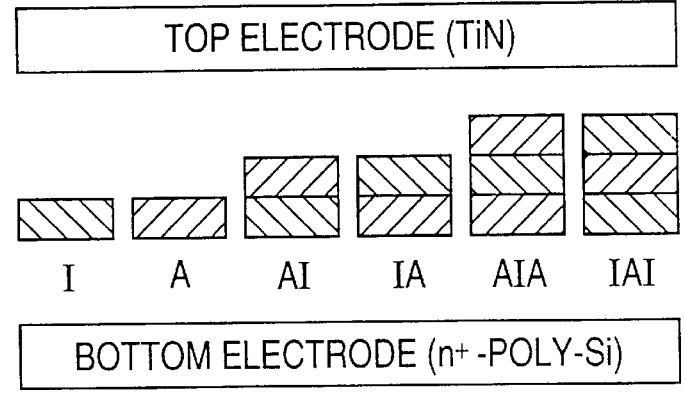
FIG. 1 is a cross-sectional view of various capacitors with single and composite dielectric films.

Referring to FIG. 1, a double layer film, noted as AI, and composed of a $Ta_2O_5$ (A) and $TiO_2$ (I) film sequentially formed on an $n^+$ poly-Si bottom electrode is shown. Also, another double layer film, noted as IA, and composed of film I and film A sequentially formed on the $n^+$ poly-Si bottom electrode is shown in FIG. 1 as well. In this and the following embodiments, both films I and A are formed by low pressure chemical deposition from a mixture of $O_2$ gas and a source gas, for example, tetra-isopropyl-titanate (Ti $(OC_3H_7)_4$, TPT) as a Ti source and pentaethoxy tantalum $(Ta(OC_5H_5)_5)$ as a Ta precursor. For $TiO_2$ deposition, the Ti source is vaporized at 60° C., and introduced into the reactor chamber using argon (Ar) gas. For $Ta_2O_5$ deposition, the Ta source is vaporized at 100° C., and introduced into the reactor chamber. The deposition temperature of $TiO_2$ and $Ta_2O_5$ is 450° C. and 350° C., respectively. Prior to deposition, the sample is treated using rapid thermal nitridation (RTN) in $NH_3$ at 900° C. for 60 seconds. After deposition, the sample is subjected to rapid thermal nitrous oxide ($N_2O$) annealing at 800° C. for 60 seconds. To be used as a MOS capacitor, Titanium nitride (TiN) and Al top electrodes are deposited on the film AI by reactive sputtering.

Figure 2A:
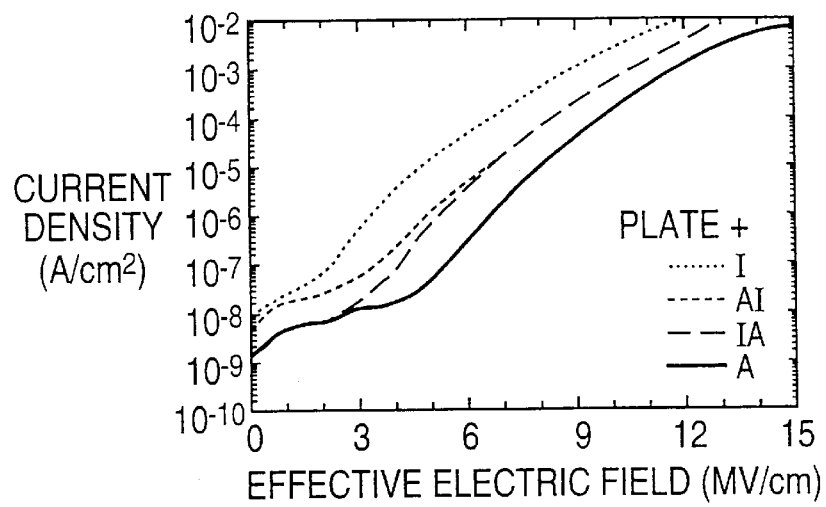
FIGS. 2(a) and FIG. 2(b) present the leakage current characteristics for single and double layer films under positive and negative polarities, respectively.
Figure 2B:
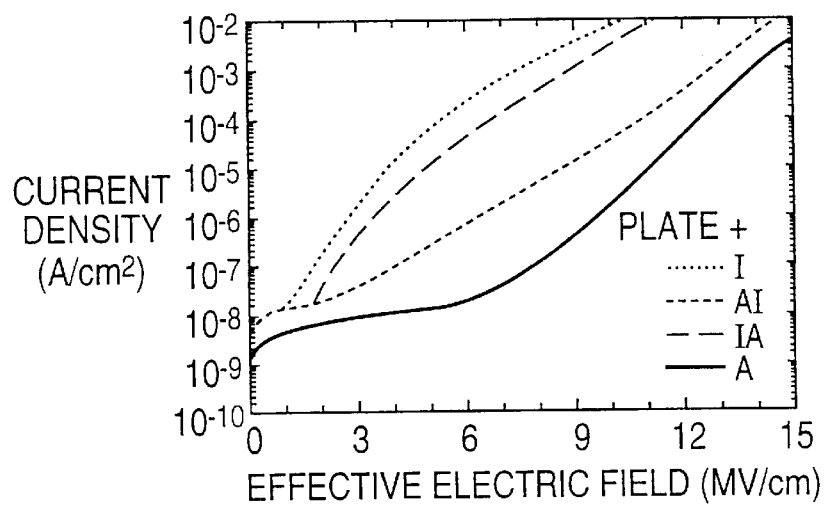

In FIG. 2a and FIG. 2b, the typical results of the leakage current characteristics of 10 nm single and double layers are shown. The effective electric field is calculated from the applied voltage and the equivalent $SiO_2$ thickness extracted from C-V measurement at 100 kHz using a value of 3.82 for the $SiO_2$ dielectric constant. For both polarities, a capacitor with film A shows the lowest leakage current, while a capacitor with film I exhibits the highest one. Noticeably, under positive polarity, the AI structure has a higher leakage current than the IA structure. This may be attributed to the reaction between the $TiO_2$ and $Ta_2O_5$ films during the post-deposition annealing treatment, in which the metallic Ta (Ti) existing in the $Ta_2O_5$($TiO_2$) film diffuses into the $TiO_2$($Ta_2O_2$) film. Owing to the stronger affinity for metallic Ti than for metallic Ta, the Ta in the $TiO_2$ film acts as an interstitial, and leads to the increase of the leakage current. In this embodiment, the amounts of Ti diffusing in $Ta_2O_5$ film can not be controlled and too much Ti results in a higher leakage current of the AI double layer as compared to the $Ta_2O_5$ single layer. As shown in FIG. 2a and FIG. 2b, I and IA structures, in which the top layer is the $TiO_2$ film, possess inferior leakage currents for negative bias than for positive bias. This may be attributed to a rougher surface of the $TiO_2$ film than the $Ta_2O_5$ film. In the case of I and IA structures, the surface roughness dominates over the effect of the work function difference between TiN and $n^+$ poly-Si. These results demonstrate that the leakage current is always higher if electrons are injected from the $TiO_2$/electrode. This implies that the $TiO_2$ and the contacting electrode play an important role in determining the electrical properties for composite films.

Figure 3:
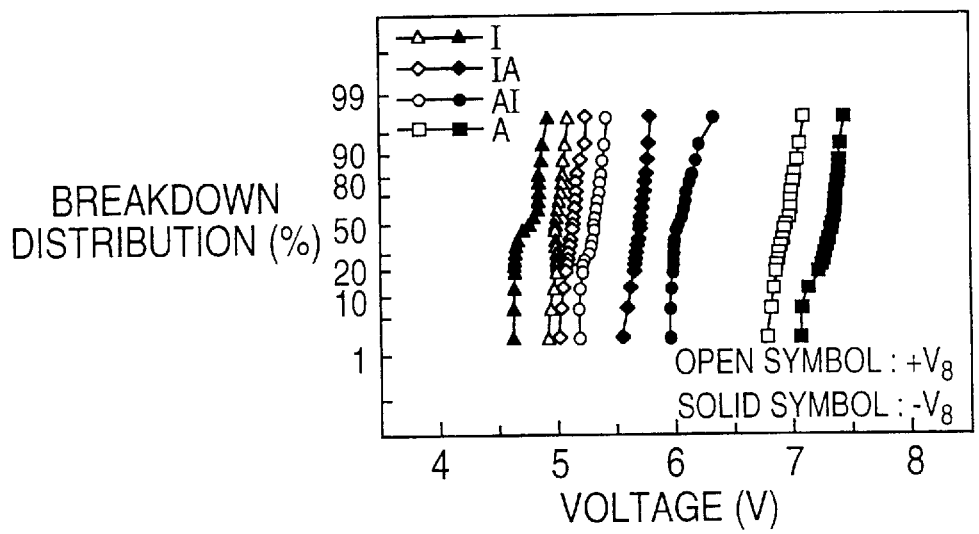
FIG. 3 shows the breakdown voltage distributions for single and double layer films.
Figure 4:
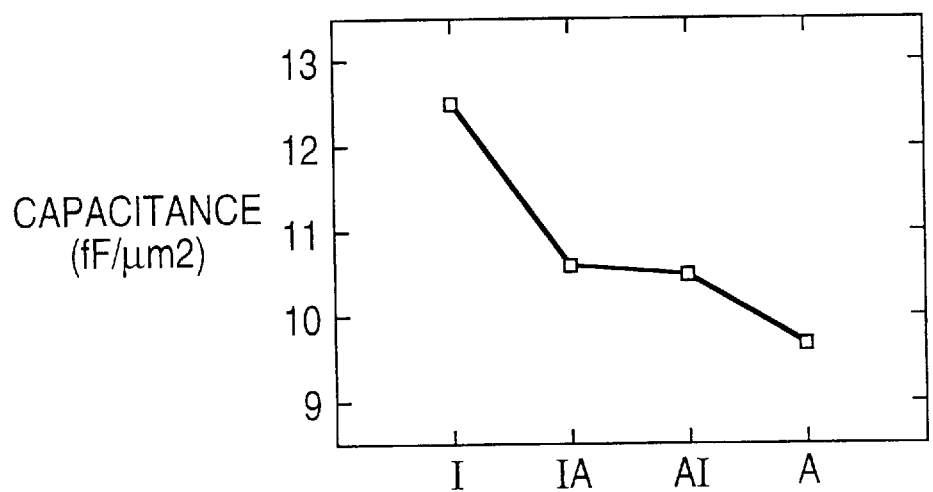
FIG. 4 presents the capacitance per unit area of single and double layer films.

The breakdown voltage distribution is shown in FIG. 3. The $Ta_2O_5$ layer has a higher breakdown voltage than the composite films. A capacitor with a $TiO_2$ dielectric film has a higher capacitance than a capacitor with a $Ta_2O_5$ film. The capacitance's for IA and AI are both higher than that for a $Ta_2O_5$ single layer. This result suggests that the combination of $TiO_2$ and $Ta_2O_5$ films is useful to increase the capacitance as compared to a single layer $Ta_2O_5$ film.

In spite of the higher capacitance behavior for the double layer structure, AI and IA are not optimal structures for composite films, based on the consideration of leakage current characteristics.

Figure 5:
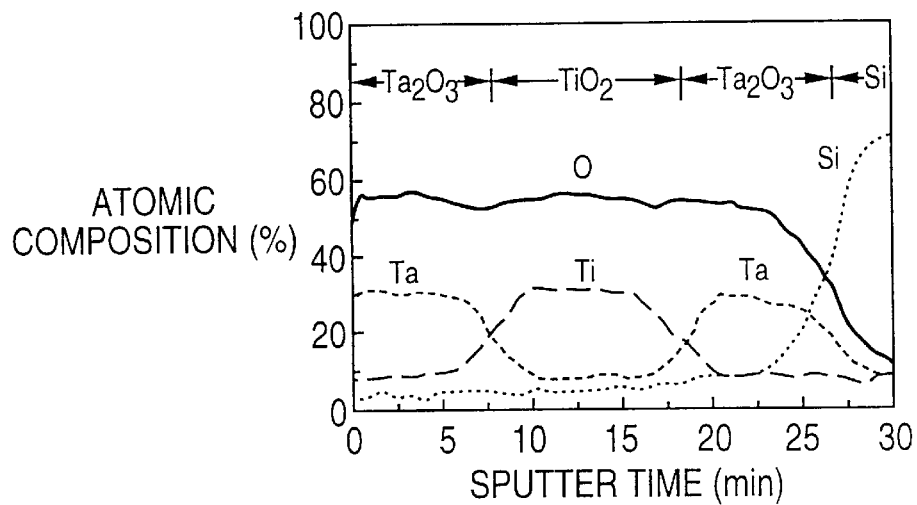
FIG. 5 is an AES depth of an AIA composite film.

Referring again to FIG. 1, a triple layer film AIA and another triple layer film IAI are deposited on an $n^+$ poly-Si bottom electrode. The method of deposition for both film A and film I are the same as for the first embodiment. Again, TiN and Al are used as the top electrode. FIG. 5 shows the AES depth profiles of the AIA structure. This result confirms the formation of multilayer structure.

Figure 6A:
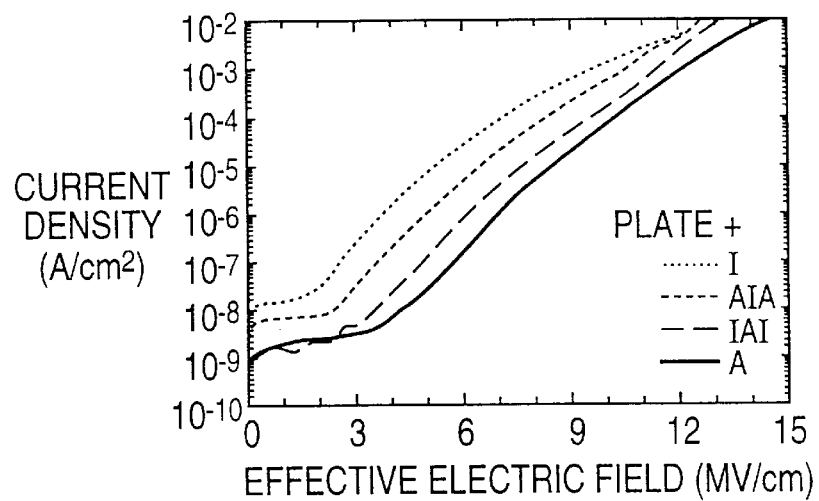
FIG. 6(a) and FIG. 6(b) present the leakage current characteristics for single and double layer films under positive and negative polarities, respectively.
Figure 6B:
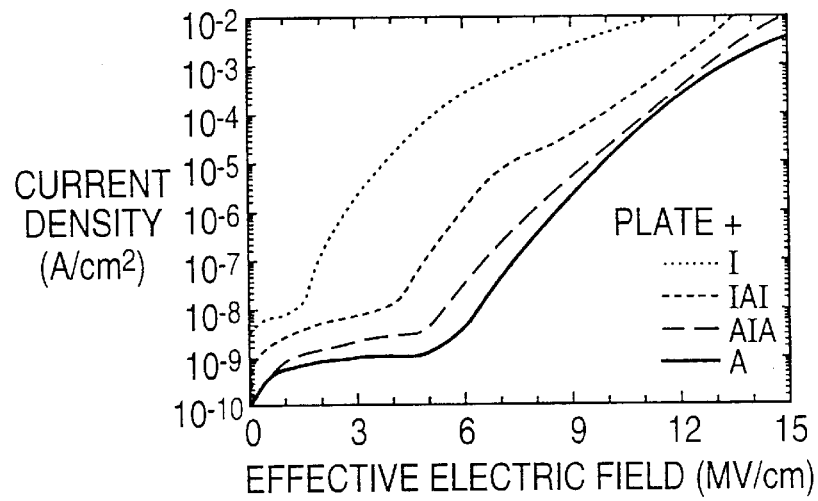

FIG. 6a and FIG. 6b compares the leakage current characteristic of 15 nm I, AIA, IAI, and A structures. The capacitor with the IAI structure shows a superior leakage current than one with an I film, and has a higher leakage current compared to the AIA structure. The foregoing implies that the leakage current is inferior if electrons are injected from the $TiO_2$/electrode. Instead, with the injection of electrons from the $Ta_2O_5$/electrode, the capacitor with the AIA structure exhibits less leakage current. Moreover, the capacitors with A and AIA structures have similar leakage current characteristics for both polarities.

Figure 7:
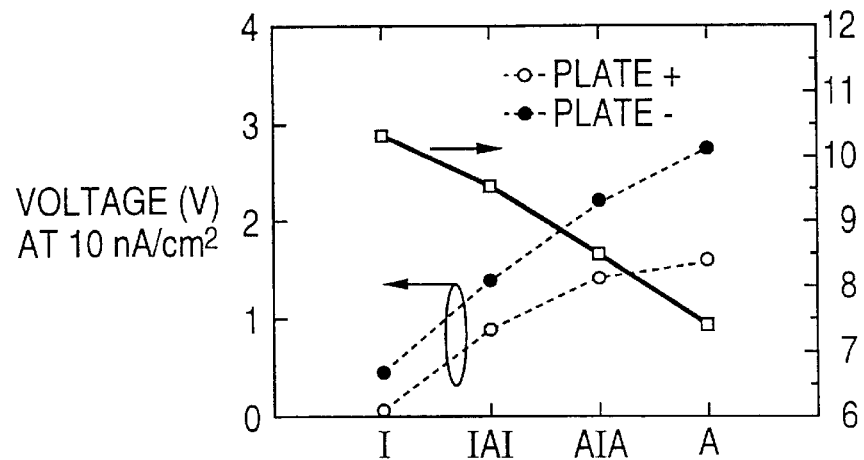
FIG. 7 shows the critical voltage and capacitance per unit area as a function of single and triple layer films.

FIG. 7 shows the critical voltage required to induce a leakage current of 10 $nA/cm_2$ and the capacitance per unit area as a function of structures. $TiO_2$ has the highest capacitance but the lowest critical voltage. $Ta_2O_5$ shows just the opposite results. Although the AIA structure has a slightly smaller $V_{crit}$ compared to the A structure, it possesses a 15% higher capacitance.

Figure 8:
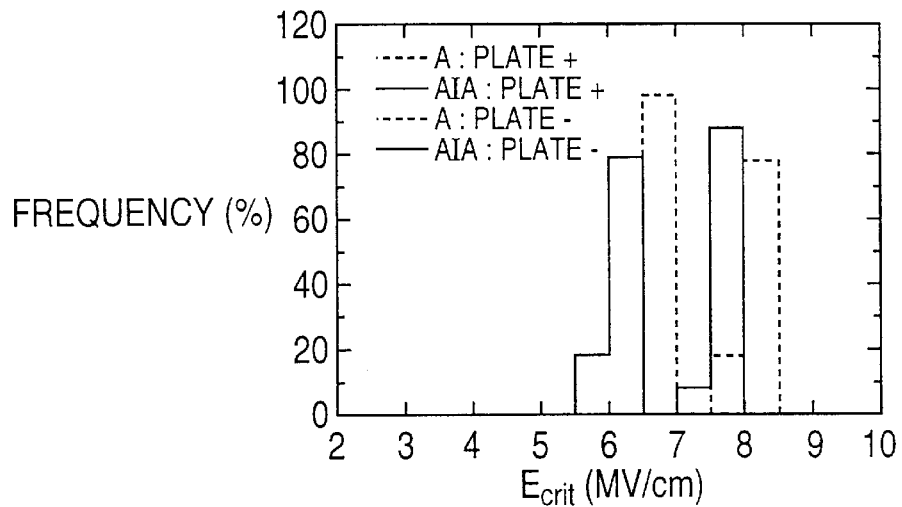
FIG. 8 presents a comparison of an A and AIA structure.

FIG. 8 shows the distribution of the critical electric field, defined at the electric field with a leakage current of 1 $\mu A/cm^2$, of the A and AIA structures at positive and negative voltages, respectively. This result shows that the distribution of the AIA structure is similar to that of the A structure.

Figure 9:
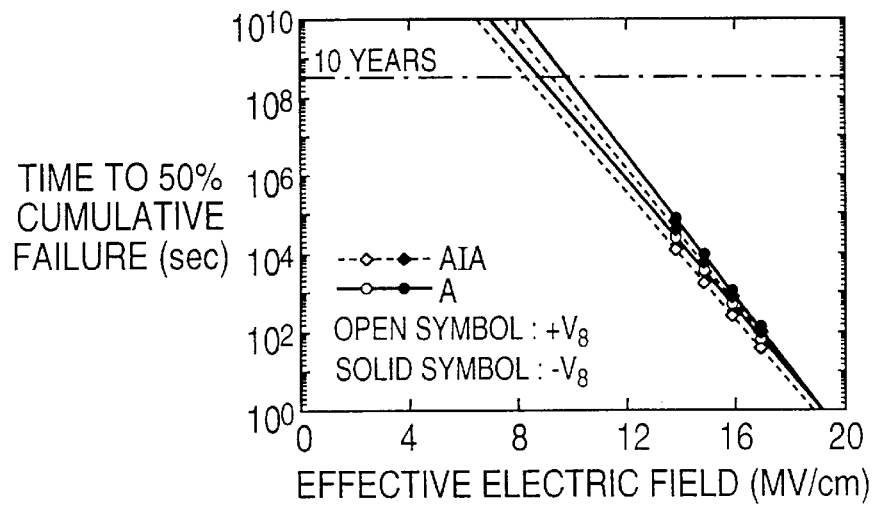
FIG. 9 shows the lifetime extraction: time to 50% cumulative failure as a function of applied field for A and AIA structures.

FIG. 9 shows the electric field dependence of time to 50% cumulative failure under both voltage stress polarities for the A and the AIA structures. This result reveals that the reliability of the composite film AIA is comparable to that of the $Ta_2O_5$ single film.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A composite dielectric film comprising:

an n+ polysilicon phosphorus-doped bottom electrode formed using rapid thermal nitration in ammonia at about 900° C. for about 60 seconds;

a titanium dioxide layer on the $n^+$ Polysilicon bottom electrode;

a tantalum Pentaoxide layer on the titanium dioxide layer; and a top electrode over the tantalum pentaoxide layer.

2. A composite dielectric film comprising:

an n+ Polysilicon bottom electrode;

a titanium dioxide layer formed on the n+ polysilicon bottom electrode using low pressure chemical vapor deposition:

from a mixture of tetra-isopropyl-titanate and oxygen gas;

vaporizing the tetra-isopropyl-titanate at about 60° C., and introducing the vaporized tetra-isopropyl-titanate into a reactor chamber using argon gas; and at a deposition temperature of about 450° C.;

a tantalum pentaoxide layer on the titanium dioxide layer; and a top electrode over the tantalum pentaoxide layer.

3. A composite dielectric film according to claim 1, comprising:

an n+ Polysilicon bottom electrode;

a titanium dioxide layer on the n+ polysilicon bottom electrode;

a tantalum pentaoxide layer formed on the titanium dioxide layer using low pressure chemical vapor deposition:

from a mixture of pentaethoxy tantalum and oxygen gas;

vaporizing the pentaethoxy tantalum at a temperature of about 100° C., and introducing the vaporized pentaethoxy tantalum into a reactor chamber using argon gas; and at a deposition temperature of about 350° C., and a top electrode over the tantalum pentaoxide layer.

4. The composite dielectric film according to claim 1, wherein the top electrode is a reactively sputtered and deposited titanium nitride and aluminum electrode.

5. A composite dielectric film, comprising:

a phosphorus doped polysilicon bottom electrode;

a first titanium dioxide layer on the phosphorus doped polysilicon bottom electrode;

a tantalum pentaoxide layer on the first titanium dioxide layer;

a second titanium dioxide layer on the tantalum pentaoxide layer; and a titanium nitride and aluminum top electrode over the second titanium dioxide layer.

6. A composite dielectric film, comprising:

a phosphorus doped polysilicon bottom electrode;

a first tantalum pentaoxide layer on the phosphorus doped polysilicon bottom electrode;

a titanium dioxide layer on the first tantalum pentaoxide layer;

a second tantalum pentaoxide layer on the titanium dioxide layer; and a titanium nitride and aluminum top electrode over the second tantalum pentaoxide layer.

7. The composite dielectric film according to claim 2, wherein the top electrode is a reactively sputtered and deposited titanium nitride and aluminum electrode.

8. The composite dielectric film according to claim 3, wherein the top electrode is a reactively sputtered and deposited titanium nitride and aluminum electrode.

* * * * *